(12) United States Patent
Matsuo

(10) Patent No.: US 6,484,192 B1
(45) Date of Patent: Nov. 19, 2002

(54) ROOT FINDING METHOD AND ROOT FINDING CIRCUIT OF QUADRATIC POLYNOMIAL OVER FINITE FIELD

(75) Inventor: Kazuto Matsuo, Kanagawa (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 09/239,170

(22) Filed: Jan. 28, 1999

(30) Foreign Application Priority Data

Jan. 29, 1998 (JP) ............................................ 10-032186

(51) Int. Cl.[7] .............................................. G06F 15/00
(52) U.S. Cl. ...................................................... 708/492
(58) Field of Search ................................ 708/252, 446, 708/492, 510, 606; 714/756, 781, 784

(56) References Cited

U.S. PATENT DOCUMENTS

| | | | | |
|---|---|---|---|---|
| 4,782,490 A | * | 11/1988 | Tenengolts | ................... 714/756 |
| 5,974,582 A | * | 10/1999 | Ly | .............................. 714/781 |
| 6,061,826 A | * | 5/2000 | Thirumoorthy et al. | ...... 714/784 |
| 6,192,497 B1 | * | 2/2001 | Yang et al. | ................... 714/781 |

* cited by examiner

Primary Examiner—Chuong Dinh Ngo
(74) Attorney, Agent, or Firm—Koda & Androlia

(57) ABSTRACT

There is provided a root finding circuit of a quadratic polynomial over a finite field, capable of operating at high speed and making the circuit scale in implementation small.

The root finding circuit includes m−3 cascade-connected exclusive OR gates $X(1, 0)$ to $X(1, m-4)$ each supplied with a corresponding bit of an arbitrary element "$a=(a_0, a_1, \ldots, a_{m-1})$" over a finite field $GF(2^m)$ at a first input thereof and each supplied with output of an exclusive OR gate of an immediately preceding stage at a second input, a second input of only $X(1, 0)$ being supplied with $a_{m-1}$ instead of the output of an exclusive OR gate of an immediately preceding stage, and $m/2-1$ exclusive OR gates $X(2, 0)$ to $x(2, m/2-2)$ respectively supplied with $a_{m-1}$ and outputs of $X(1, 1)$, $X(1, 3), \ldots, X(1, m-5)$ at first inputs and each supplied with $a_0$ at a second input thereof. Outputs of the exclusive OR gates $X(2, 0)$ to $X(2, m/2-2)$, outputs of the exclusive OR gates $X(1, 0)$, $X(1, 2), \ldots, X(1, m-4)$, and the $a_0$ are output as a root $z=(z_0, z_1, \ldots, z_{m-1})$ of $z^2+z+a$.

6 Claims, 2 Drawing Sheets

ROOT FINDING METHOD AND ROOT FINDING CIRCUIT OF QUADRATIC POLYNOMIAL OVER FINITE FIELD

BACKGROUND OF THE INVENTION

1. Field of the Invention

The present invention relates to a root finding method and a root finding circuit of a one-element quadratic polynomial over a finite field used for elliptic cryptosystem and the like.

2. Description of Related Art

Prior to describing a conventional technique, computation of a finite field will first be described.

(Computation of Finite Field),

A finite field $GF(2^m)$ is a set formed of $2^m$ elements, and each element is represented using vector representation. An element of the degree $2^m-1$ is referred to as primitive root. According to the vector representation, $GF(2^m)$ is regarded as an m dimensional vector space of $GF(2)$, and an arbitrary element "a" is represented by an m dimensional numerical vector $(a_0, a_1, \ldots, a_{m-1})$, where each component $a_i$ of the vector is an element over $GF(2)$, i.e., 0 or 1. In vector representation, a vector space is not limited to one type of basis, and representation of an element can vary depending on the basis used.

As for the basis, there are a normal basis and a polynomial basis. The normal basis uses a basis as shown below.

$$(\alpha, \alpha^2, \alpha^{2^2}, \ldots, \alpha^{2^{m-1}})$$

where the primitive root $\alpha$ is used so that the followings are linearly independent.

$$\alpha, \alpha^2, \alpha^{2^2}, \ldots, \alpha^{2^{m-1}}$$

The polynomial basis is a basis $(1, z, z^2, \ldots z^{m-1})$ which is generated from a monic irreducible polynomial of degree m "f" over $GF(2)$ serving as a generation polynomial using an element "z" which is the root of "f". Here, $a=(a_0, a_1, \ldots, a_{m-1})$ is regarded as an element over $GF(2)[x]$ where x is a variable, and "a" is represented by $a = a_{m-1}x^{m-1} + \ldots + a_1 x + a_0$. This representation is referred to as polynomial representation.

Addition of two elements "a" and "b" over $GF(2^m)$ is represented by $a+b=(a_0+b_0, a_1+b_1, \ldots, a_{m-1}+b_{m-1})$. That is, the two elements may be added over $GF(2)$ for each component. The addition over $GF(2)$ is carried out as Exclusive OR. As for the multiplication of two elements "a" and "b" over $GF(2m)$, methods each employing a normal basis are described in U.S. Pat. No. 4,587,627, "Computational Method and Apparatus for Finite Field Arithmetic" and U.S. Pat. No. 4,745, 568, "Computational Method and Apparatus for Finite Field Multiplication." Each of these methods has a drawback that a circuit for implementation is complicated and the circuit scale becomes very large when m is large. The multiplication using a normal basis is described in detail in A. J. Menezes, Ed, "Applications of Finite Fields", Kluwer Academic Pub. On the other hand, the method using a polynomial basis is described in detail in J. Weldolon, Jr., "Error-Correcting Codes", MIT Press. As compared with the multiplication using a normal basis, the method using the polynomial basis has an advantage that the circuit is simple, the circuit scale does not become so large even when m is large, and high speed operation with a high rate clock is possible.

(Elliptic Cryptosystem)

The elliptic cryptosystem is a cryptosystem using addition of $GF(2^m)$ rational points of an elliptic curve $$E: y^2+xy=x^3+c_1 x^2+c_2, \ c_i \in GF(2^m)$$

over $GF(2^m)$. In this cryptosystem, a message is mapped onto a rational point over an elliptic curve E to form an encrypted sentence at the time of encryption. At the time of decryption, the encrypted sentence is mapped onto a rational point over an elliptic curve E to restore the original message.

In this elliptic cryptosystem, the encrypted sentence is formed of a rational point $(x_c, y_c)$ on the elliptic curve E. A message having m bits becomes 2m bits when encrypted. This results in a drawback that the size of the encrypted sentence becomes twice as compared with other cryptosystems using an information group over a finite field. For eliminating this drawback, there is such a method as to make the encrypted sentence have a size which is equal to one bit plus the size obtained when other cryptosystems using an information group over a finite field are employed. For implementing this, it is necessary to find roots of a quadratic polynomial over $GF(2^m)$.

(Mapping from Message onto Rational Point)

For mapping a message onto a rational point, typically the message is subjected to binary expansion, and blocking every m' bits, where m'<m. This message is used as components of m' high-order bits of an element M of $GF(2^m)$ represented as a vector, and components of m−m' low-order bits are filled up with a random number. This element M is associated with an x coordinate of the elliptic curve E. A rational point having an x coordinate equivalent to the element M is calculated. In other words, y satisfying the relation $$y^2+My=M^3+c_1 M^2+c_2$$

is found. If y does not exist, then the m−m' low-order bits are filled up with a different random number, and y is found again. If y exists and y is found to be Y, the map of the message onto a rational point is defined to be (M, Y).

If at this time the elliptic curve E is converted in variable by $z=y/x$, then z satisfying the relation $$z^2+z=a$$

where $$a = M + c_1 + \frac{c_2}{M^2}$$

is found. From this z, $Y=Mz$ is found. Mapping from the message to the point has thus been conducted.

(Reduction of Encrypted Sentence)

Since the elliptic curve E can be represented by a quadratic polynomial as described above, there are only two rational points on the elliptic curve E each of which has an element X over $GF(2m)$ as the value of its x coordinate. Therefore, a cryptosystem sentence (X, Y) can be represented by X and 1-bit information. If $z=Y/X$ is found and its lowest order bit $z_0$ is used as the cryptograph sentence together with X, therefore, then the cryptograph sentence is reduced by m−1 bits. In the case where this method is used, Y corresponding to X can be found by letting the least significant bit be $z_0$ and solving $z^2+z=a$ and, $$a = X + c_1 + \frac{c_2}{X^2}$$

and letting $Y=Xz$ at the time of decryption. The cryptograph sentence (X,Y) can be thus reconstructed. The configuration of the elliptic cryptosystem is described in detail in A. J.

Menezes, "Elliptic Curve Public Key Cryptosystems", Kluwer Academic Pub.

As for the root finding method of the quadratic polynomial, a method of the case where a normal basis is used is generally known. As described above, however, multiplication using a normal basis involves a complicated circuit. In addition, a root finding method, and root finding apparatus of the quadratic polynomial has not been known to the person in the art.

SUMMARY OF THE INVENTION

The present invention has been conceived to solve the above described problem. An object of the present invention is to provide a root finding method, and root finding apparatus, of a quadratic polynomial over a finite field using a polynomial basis capable of operating at high speed and making the circuit scale in implementation small.

The above described object is achieved by the following aspects of the present invention.

In accordance with a first aspect of the present invention, assuming that an expansion degree m is selected so that a polynomial $f=x^m+x^{m-1}+\ldots x+1$ over GF(2) is irreducible and the polynomial f is used as a generation polynomial of GF($2^m$), a root finding circuit of a quadratic polynomial includes m−3 cascade-connected exclusive OR gates X(1, 0) to X(1, m−4) each supplied with a corresponding bit of the element "a" at a first input thereof and each supplied with output of an exclusive OR gate of an immediately preceding stage at a second input, a second input of only X(1, 0) being supplied with $a_{m-1}$ instead of the output of an exclusive OR gate of an immediately preceding stage, and m/2−1 exclusive OR gates X(2, 0) to X(2, m/2−2) respectively supplied with $a_{m-1}$ and outputs of X(1, 1), X(1, 3), ..., X(1, m−5) at first inputs and each supplied with $a_0$ at a second input thereof, in which outputs of the exclusive OR gates X(2, 0) to X(2, m/2−2), and outputs of the exclusive OR gates X(1, 0), X(1, 2), ..., X(1, m−4), and the $a_0$ are output as a root $z=(z_0, z_1, \ldots, z_{m-1})$ of $z^2+z+a$.

In accordance with a second aspect of the present invention, a root finding circuit of a quadratic polynomial includes an exclusive OR gate X(1, m−3) supplied with a corresponding bit of the element "a" and the output of X(1, m−4) at inputs thereof, and output of the exclusive OR gate X(1, m−3) is output together with outputs of the other exclusive OR gates.

In accordance with a third aspect of the present invention, a root finding circuit of a quadratic polynomial includes m−3 cascade-connected exclusive OR gates X(1, 0) to X(1, m−4) each supplied with a corresponding bit of the element "a" at a first input thereof and each supplied with output of an exclusive OR gate of an immediately preceding stage at a second input, a second input of only X(1, 0) being supplied with $a_{m/2}$ instead of the output of an exclusive OR gate of an immediately preceding stage, and m/2−1 exclusive OR gates X(2, 0) to X(2, m/2−2) respectively supplied with outputs of X(1, 0), X(1, 2), ..., X(1, m−4) at first inputs and each supplied with $a_0$ at a second input thereof, and outputs of the exclusive OR gates X(2, 0) to X(2, m/2−2), outputs of the exclusive OR gates X(1, 1), X(1, 3), ..., X(1, m−5), $a_{m/2}$, and $a_0$ are output as a root $z=(z_0, z_1, \ldots, z_{m-1})$ of $z^2+z+a$.

In accordance with a fourth aspect of the present invention, a root finding circuit of a quadratic polynomial over includes an exclusive OR gate X(1, m−3) supplied with a corresponding bit of the element "a" and the output of X(1, m−4) at inputs thereof, and output of the exclusive OR gate X(1, m−3) is output together with outputs of the other exclusive OR gates.

In accordance with a fifth aspect of the present invention, a root finding circuit of a quadratic polynomial includes a first circuit for finding n outputs z (where n<m−1) by using exclusive OR gates of a predetermined number of stages beginning from a first stage of the circuit according to the first aspect, and a second circuit for finding such m−1n outputs z that those outputs and the output z of the first circuit will not duplicate, by using exclusive OR gates of a predetermined number of stages beginning from a first stage of the circuit according to the second aspect, the second circuit is connected to the first circuit, and all of the roots $z=(z_0, z_1, \ldots, z_{m-1})$ of $z^2+z+a$ are found.

In accordance with a sixth aspect of the present invention, a root finding circuit of a quadratic polynomial includes an exclusive OR gate supplied with output of a final stage of the cascade-connected exclusive OR gates in the first circuit at a first input thereof and supplied with output of a final stage of the cascade-connected exclusive OR gates in the second circuit at a second input thereof, and an output of the exclusive OR gate is output together with outputs of the other exclusive OR gates.

In accordance with a seventh aspect of the present invention, assuming that a polynomial $f=x^m+x^{m-1}+\ldots x+1$ over GF(2) is irreducible and has an expansion degree m and the f is used as a generation polynomial of GF($2^m$), a root finding method of a quadratic polynomial includes the steps of deriving an exclusive OR of mutually corresponding bits of the element "a", letting the derived exclusive OR value be a value of a corresponding bit of z, thereafter letting a value of an exclusive OR between a corresponding bit of the element "a" and immediately derived bit of z be a value of next corresponding bit of z, and thereafter repeating these steps and thereby find z.

DESCRIPTION OF THE PREFERRED EMBODIMENTS

Figure 1:
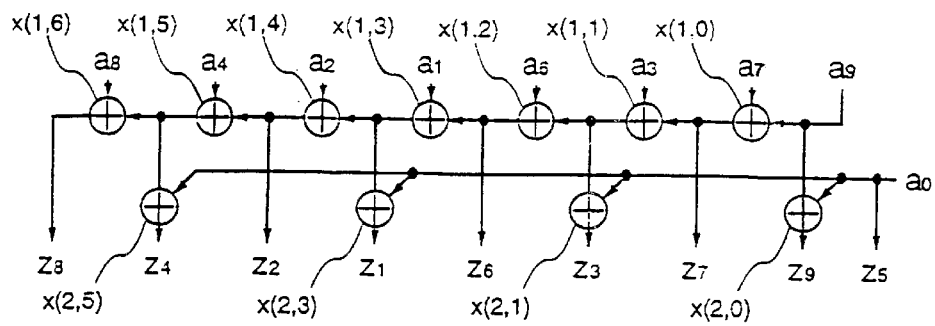
FIG. 1 is a circuit configuration diagram showing a first embodiment of the present invention.

Hereafter, the principle of the present invention will be described in detail.

It is now assumed that the generation polynomial over GF($2^m$) is $f=x^m+\ldots+x+1$, and the vector representation of "a" using a polynomial basis is given as described above. Here, $z^2+z=a$ is worked out. At this time, z and $z^2$ are represented as $z=(z_0, z_1, \ldots, z_{m-1})$ and $z^2=s=(S_0, S_1, \ldots, S_{m-1})$, respectively, and $z_0$ to $z_{m-1}$ is found. It is known that the following relation holds true when the generation polynomial f takes the above described form.

$$S_k = \begin{cases} z_{\frac{m-1}{2}}; k = m-1 \\ z_{\frac{k}{2}} \oplus z_{\frac{m}{2}}; k\text{:even} \\ z_{\frac{m+1+k}{2}} \oplus z_{\frac{m}{2}}; k\text{:odd} \end{cases} \quad (1)$$

(See Itoh, Tsujii, "Structure of Parallel Multipliers for a Class of Fields GF($2^m$)," Information and Computation, Vol. 83, No. 1, 1989 and Hasan, Wang, Bhargava, "Modular Construction of Low Complexity Parallel Multipliers for a Class of Finite Fields GF($2^m$)," IEEE Trans, on Comp., Vol. 41, No. 8, 1992.)

By the way, "ab" represents operation of exclusive OR of a and b.

By representing as $$z^2 + z = b = (b_0, b_1, \ldots, b_{m-1}),$$

the following expression (2) is obtained from the equation (1).

$\frac{m}{2}$:even $$b_k = \begin{cases} z_{\frac{m}{2}}; k = 0 \\ z_{\frac{m}{4}}; k = \frac{m}{2} \\ z_{m-1} \oplus z_{\frac{m}{2}}; k = m-1 \\ z_k \oplus z_{\frac{k}{2}} \oplus z_{\frac{m}{2}}; k\text{:even} \\ z_k \oplus z_{\frac{m+1+k}{2}} \oplus z_{\frac{m}{2}}; k\text{:odd} \end{cases} \quad (2)$$

$\frac{m}{2}$:odd $$b_k = \begin{cases} z_{\frac{m}{2}}; k = 0 \\ z_{\frac{3m+2}{4}}; k = \frac{m}{2} \\ z_{m-1} \oplus z_{\frac{m}{2}}; k = m-1 \\ z_k \oplus z_{\frac{k}{2}} \oplus z_{\frac{m}{2}}; k\text{:even} \\ z_k \oplus z_{\frac{m+1+k}{2}} \oplus z_{\frac{m}{2}}; k\text{:odd} \end{cases} \quad (2)$$

By working out the expression (2) for z, the following expression (3) is obtained.

$\frac{m}{2}$:even $$Z_k = \begin{cases} \text{indefinite}, k = 0 \\ b_{\frac{m}{2}}; k = \frac{m}{4} \\ b_0; k = \frac{m}{2} \\ b_{m-1} \oplus z_{\frac{m}{2}}; k = m-1 \\ b_k \oplus z_{\frac{k}{2}} \oplus z_{\frac{m}{2}}; k\text{:even} \\ b_k \oplus z_{\frac{m+1+k}{2}} \oplus z_{\frac{m}{2}}; k\text{:odd} \end{cases} \quad (3)$$

$\frac{m}{2}$:odd $$Z_k = \begin{cases} \text{indefinite}, k = 0 \\ b_0; k = \frac{m}{2} \\ b_{\frac{m}{2}}; k = \frac{3m+2}{4} \\ b_{m-1} \oplus z_{\frac{m}{2}}; k = m-1 \\ b_k \oplus z_{\frac{k}{2}} \oplus z_{\frac{m}{2}}; k\text{:even} \\ b_k \oplus z_{\frac{m+1+k}{2}} \oplus z_{\frac{m}{2}}; k\text{:odd} \end{cases} \quad (3)$$

By letting b=a in the expression (3), the solution of z is obtained. Furthermore, $z_{m/2} = a_0$ is immediately obtained.

By further modifying the expression (3), the following expression (4) is obtained.

$$Z_k = \begin{cases} \text{indefinite}, k = 0 \\ z_{2k} \oplus a_{2k} \oplus a_0; 0 < k < \frac{m}{2} \\ a_0; k = \frac{m}{2} \\ z_{2k-m-1} \oplus a_{2k-m-1} \oplus a_0; \frac{m}{2} < k < m-1 \\ a_{m-1} \oplus a_0; k = m-1 \end{cases} \quad (4)$$

From the expression (4), $z_1$ is obtained successively from $z_{m-1}$. In other words, the following sequence (5) is obtained.

$$z_{m/2} = a_0$$

$$z_{m-1} = a_{m-1} \oplus a_0$$

$$z_{m-3} = z_{m-1} \oplus a_0 \quad (5)$$

By finding $z_1$ successively in the above described sequence (5), finally $z_{m/4}$ is obtained when m/2 is even, and $z_{(3m+2)/4}$ is obtained when m/2 is odd. When each of them is equal to $a_{m/2}$, $z^2+z+a$ is supposed to have a root over GF($2^m$). Otherwise, $z^2+z+a$ is supposed not to have a root over GF($2^m$). Depending on the application, $z_0$ may be 0 or 1. For example, when the sequence is used in mapping of elliptic cryptosystem onto a rational point, $z_0$ may be either value of 0 and 1. When the sequence is used for reconstruction of a rational point from reduced cryptograph sentence, $z_0$ has a given value.

Of course, it is also possible to produce a sequence from $z_{m/4}$ if m/2 is even, and from $z_{(3m+2)/b\ 4}$ if m/2 is odd by tracing the sequence (5) inversely. In that case, it can be determined by checking the value of $z_{m-1}$ whether a root exists. Furthermore, a configuration using both the sequence (5) and its inverse sequence is also possible.

Hereafter, embodiments of the present invention will be described in detail on the basis of the drawing and calculation examples.

Assuming now that GF($2^m$) is GF($2^{10}$), i.e., m=10, description will be given. Furthermore, it is assumed that the generation polynomial f is $f = x^{10} + x^9 + x^8 + x^7 + x^6 + x^5 + x^4 + x^3 + x^2 + x + 1$.

At this time, the sequence (5) becomes the following sequence (S1).

$$z_5 = a_0$$

$$z_9 = a_9 \oplus a_0$$

$$z_7 = z_9 \oplus a_7 \oplus a_0$$

$$z_3 = z_7 \oplus a_3 \oplus a_0$$

$z_6 = z_3 \oplus a_6 \oplus a_0$ $z_1 = z_6 \oplus a_1 \oplus a_0$ $z_2 = z_1 \oplus a_2 \oplus a_0$ $z_4 = z_2 \oplus a_4 \oplus a_0$ $z_8 = z_4 \oplus a_8 \oplus a_0$ (S1)

By successively working out this sequence and determining whether $z_8 = a_5$, z is obtained. The inverse sequence becomes the following sequence (S2).

$z_5 = a_0$ $z_8 = a_5$ $z_4 = z_8 \oplus a_8 \oplus a_0$ $z_2 = z_4 \oplus a_4 \oplus a_0$ $z_1 = z_2 \oplus a_2 \oplus a_0$ $z_6 = z_1 \oplus a_1 \oplus a_0$ $z_3 = z_6 \oplus a_6 \oplus a_0$ $z_7 = z_3 \oplus a_3 \oplus a_0$ $z_9 = z_7 \oplus a_7 \oplus a_0$ (S2)

By successively solving this sequence and determining whether $z_9 = a_9 \oplus a_0$, z is obtained.

Furthermore, by working out both the sequence (S1) and (S2) up to an arbitrary $z_i$ and determining whether $z_i$ in the sequence (S1) coincides with $z_i$ in the sequence (S2), z can be obtained. For example, it is possible to adopt such a configuration that z is found in the following sequence (S3) and existence of a root is checked by determining whether $z_6$ in the sequence (S1) coincides with $z_6$ in the sequence (S2).

$z_5 a_0$ (S1)

$z_9 = a_9 \oplus a_0$ $z_7 = z_9 \oplus a_7 \oplus a_0$ $z_3 = z_7 \oplus a_3 \oplus a_0$ $z_6 = z_3 \oplus a_6 \oplus a_0$ (S2)

$z_8 = a_5$ $z_4 = z_8 \oplus a_8 \oplus a_0$ $z_2 = z_4 \oplus a_4 \oplus a_0$ $z_1 = z_2 \oplus a_2 \oplus a_0$ $z_6 = z_1 \oplus a_1 \oplus a_0$ (S3)

As a matter of course, check of root existence is not necessary in the case where it is known that there exists over $GF(2^m)$ certainly, such as the case where a rational point is reconstructed from a reduced cryptograph sentence.

A circuit implementing the above described root finding will now be described.

FIG. 1 is a block diagram showing a first embodiment of a root finding circuit according to the present invention. This circuit implements the sequence (S1) and does not conduct the root existence check. In FIG. 1, each of $a_0$ to $a_9$ is its input for calculating a root of $z^2 + z + a$, and it is each bit of $a = (a_0, a_1, \ldots, a_{m-1})$. Furthermore, each of $z_1$ to $z_9$ is its output, and it is each bit of $z = (z_0, z_1, \ldots z_{m-1})$ when the condition $z^2 + z + a = 0$ is satisfied. Furthermore, $\oplus$ represents an exclusive OR device. The operation time of the exclusive OR device is denoted by T. If "a" is input to this circuit, z is output when 7 T has elapsed. It is indicated that this circuit is a circuit outputting correct z from the sequence (S1) and $a_0 \oplus a_0 = 0$.

Figure 2:
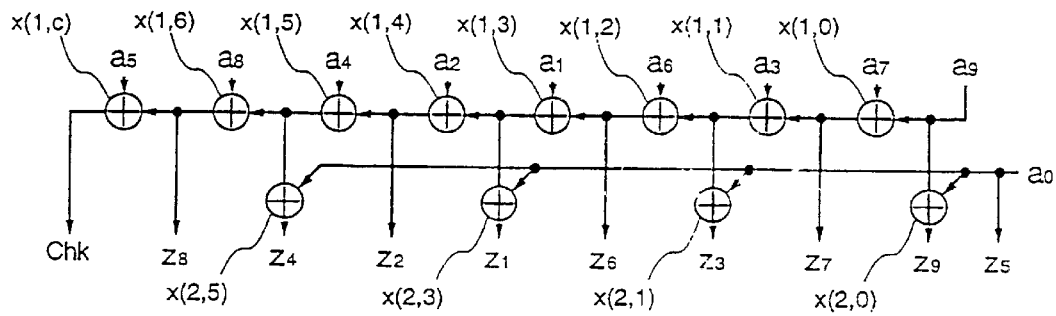
FIG. 2 is a circuit configuration diagram showing a variant of the first embodiment of the present invention.

A variant of the first embodiment is shown in FIG. 2. This circuit is obtained by adding root existence check to the circuit of FIG. 1. In FIG. 2, Chk is its output, and outputs 0 or 1 depending upon whether a root exists or not. If "a" is input to this circuit, z and the root existence are output when 8T has elapsed.

Figure 3:
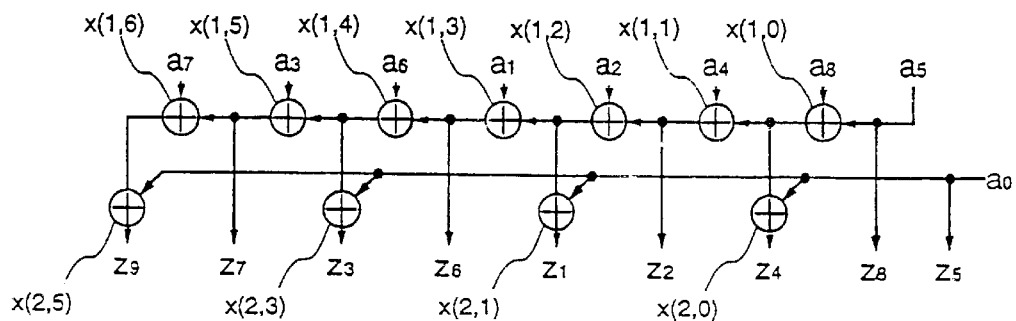
FIG. 3 is a circuit configuration diagram showing a second embodiment of the present invention.

FIG. 3 is a block diagram showing a second embodiment of a root finding circuit according to the present invention. This circuit implements the sequence (S2) and does not conduct the root existence check. Symbols in FIG. 2 have the same meaning as those of FIG. 1. If "aa" is input to this circuit, z is output when 8 T has elapsed. It is indicated that this circuit is a circuit immediately outputting correct z from the sequence (S2) and $a_0 \oplus a_0 0$.

Figure 4:
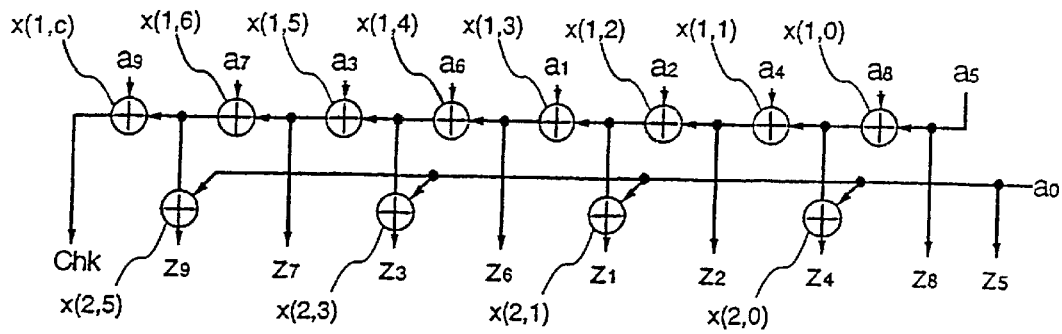
FIG. 4 is a circuit configuration diagram showing a variant of the second embodiment of the present invention.

A variant of the second embodiment is shown in FIG. 4. This circuit is obtained by adding root existence check to the circuit of FIG. 3. Symbols in FIG. 4 have the same meaning as those of FIG. 2. In FIG. 4, Chk is its output, and outputs 0 or 1 depending upon whether a root exists or not. If "a" is input to this circuit, z and the root existence are output when 8 T has elapsed. It is indicated that the root existence check of this circuit outputs a correct result from the following expression.

$z_9 \oplus a_9 \oplus a_0 = z_7 \oplus a_7 \oplus a_9$

Figure 5:
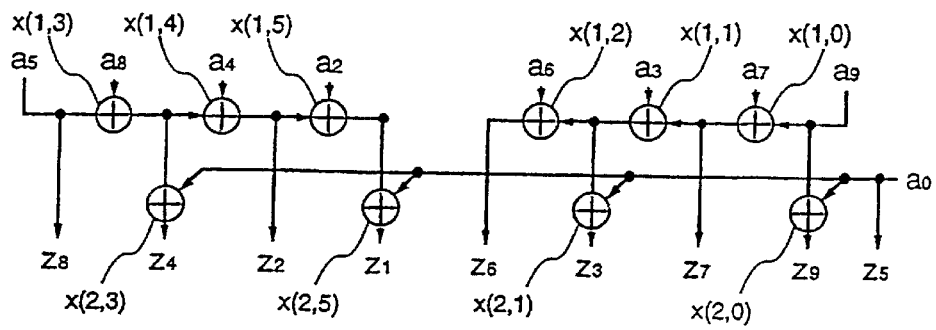
FIG. 5 is a circuit configuration diagram showing a third embodiment of the present invention.

FIG. 5 is a block diagram showing a third embodiment of a root finding circuit according to the present invention. This circuit implements the sequence (S3) and does not conduct the root existence check. Symbols in FIG. 5 have the same meaning as those of FIG. 1. If "a" is input to this circuit, z is output when 4 T has elapsed.

Figure 6:
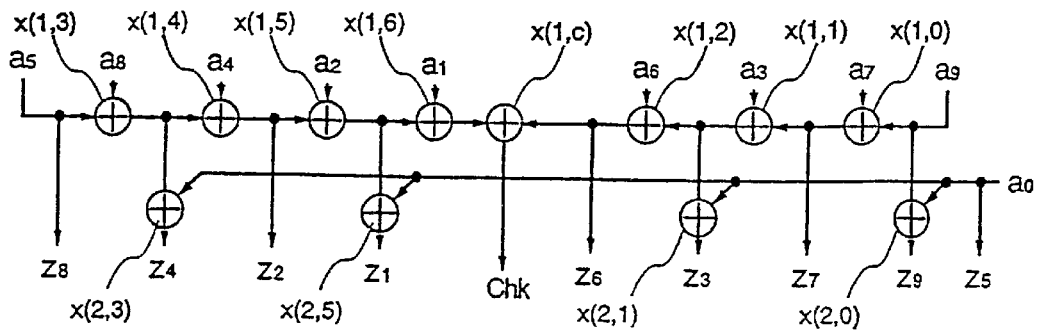
FIG. 6 is a circuit configuration diagram showing a variant of the third embodiment of the present invention.

A variant of the third embodiment is shown in FIG. 6. This circuit is obtained by adding root existence check to the circuit of FIG. 5. The root existence is checked by determining whether $z_6$ coincides. Symbols in FIG. 6 have the same meaning as those of FIG. 2. If "a" is input to this circuit, z and the root existence are output when 5 T has elapsed.

In configuration of each of the third embodiment and its variant, $z_6$ is used as a boundary, and both a circuit for finding $(z_5, z_9, z_7, z_3, z_1) = z$ according to the sequence (S1) and a circuit for finding $(z_8, z_4, z_2, z_1) = z$ according to the inverse sequence (S2) are used. However, the present invention is not limited to this, but any z may be used as the boundary.

In other words, any configuration may be employed so long as a circuit for finding n outputs z (where n<m−1) by using devices of a predetermined number of stages beginning from the first stage of the circuit according to the sequence (S1) and a circuit for finding such m−1−n outputs z that those outputs and the output z of the circuit according to the sequence (S1) will not overlap, by using devices of a predetermined number of stages beginning from the first stage of the circuit according to the sequence (S2) are connected to each other, and all of the roots $z = (z_0, z_1, \ldots, z_{m-1})$ of $z^2 + z + a$ are found.

Heretofore, embodiments in which the present invention has been applied to the expansion degree m=10 have been described as an example. However, the present invention is not limited to this, but the present invention can be applied to an arbitrary degree m by which f is irreducible.

Each of the above described embodiments is formed by using only logic devices, however, it can also be formed by using a sequential circuit.

Since the present invention is formed as heretofore described, it becomes possible to provide a root finding method, and root finding circuit, of a quadratic polynomial over a finite field capable of operating at high speed and making the circuit scale in implementation small. A significant effect is obtained in reducing the number of bits of a sentence encrypted by using the elliptic cryptosystem.

What is claimed is:

1. A root finding circuit of a quadratic polynomial over a finite field, for finding roots of a quadratic polynomial $z^2+z+a$ over a finite field $GF(2^m)$ with respect to an arbitrary element $a=(a_0, a_1, \ldots, a_{m-1})$ over the finite field $GF(2^m)$, a polynomial $f=x^m+x^{m-1}+\ldots x+1$ over $GF(2)$ being irreducible and having an expansion degree m, said f being used as a generation polynomial of $GF(2^m)$, said root finding circuit comprising:

m−3 cascade-connected exclusive OR gates $X(1, 0)$ to $X(1, m-4)$ each supplied with a corresponding bit of said element "a" at a first input thereof and each supplied with output of an exclusive OR gate of an immediately preceding stage at a second input, a second input of only $X(1, 0)$ being supplied with $a_{m-1}$ instead of the output of an exclusive OR gate of an immediately preceding stage; and m/2−1 exclusive OR gates $X(2, 0)$ to $X(2, m/2-2)$ respectively supplied with $a_{m-1}$ and outputs of $X(1, 1)$, $X(1, 3), \ldots, X(1, m-5)$ at first inputs and each supplied with $a_0$ at a second input thereof, wherein outputs of said exclusive OR gates $X(2, 0)$ to $X(2, m/2-2)$, outputs of said exclusive OR gates $X(1, 0)$, $X(1, 2), \ldots, X(1, m-4)$, and said $a_0$ are output as a root $z=(z_0, z_1, \ldots, z_{m-1})$ of $z^2+z+a$.

2. A root finding circuit of a quadratic polynomial over a finite field according to claim 1, comprising an exclusive OR gate $X(1, m-3)$ supplied with a corresponding bit of said element "a" and the output of $X(1, m-4)$ at inputs thereof, output of said exclusive OR gate $X(1, m-3)$ being output together with outputs of said other exclusive OR gates.

3. A root finding circuit of a quadratic polynomial over a finite field, for finding roots of a quadratic polynomial $z^2+z+a$ over a finite field $GF(2^m)$ with respect to an arbitrary element $a=(a_0, a_1, \ldots, a_m)$ over the finite field $GF(2^{m-1})$, a polynomial $f=x^{+xm-1}+\ldots x+1$ over $GF(2)$ being irreducible and having an expansion degree m, said f being used as a generation polynomial of $GF(2^m)$, said root finding circuit comprising:

m−3 cascade-connected exclusive OR gates $X(1, 0)$ to $X(1, m-4)$ each supplied with a corresponding bit of said element "a" at a first input thereof and each supplied with output of an exclusive OR gate of an immediately preceding stage at a second input, a second input of only $X(1, 0)$ being supplied with $a_{m/2}$ instead of the output of an exclusive OR gate of an immediately preceding stage; and m/2−1 exclusive OR gates $X(2, 0)$ to $X(2, m/2-2)$ respectively supplied with outputs of $X(1, 0)$, $X(1, 2), \ldots, X(1, m-4)$ at first inputs and each supplied with $a_0$ at a second input thereof, wherein outputs of said exclusive OR gates $X(2, 0)$ to $X(2, m/2-2)$, outputs of said exclusive OR gates $X(1, 1)$, $X(1, 3), \ldots, X(1, m-5)$, $a_{m/2}$, and a are output as a root $z=(z_0, z_1, \ldots, z_{m-1})$ of $z^2+z+a$.

4. A root finding circuit of a quadratic polynomial over a finite field according to claim 3, comprising an exclusive OR gate $X(1, m-3)$ supplied with a corresponding bit of said element "a" and the output of $X(1, m-4)$ at inputs thereof, output of said exclusive OR gate $X(1, m-3)$ being output together with outputs of said other exclusive OR gates.

5. A root finding circuit of a quadratic polynomial over a finite field, for finding roots of a quadratic polynomial $z^2+z+a$ over a finite field $GF(2^m)$ with respect to an arbitrary element $a=(a_0, a_1, \ldots, a_{m-1})$ over the finite field $GF(2^m)$, a polynomial $f=x^m+x^{m-1}+\ldots x+1$ over $GF(2)$ being irreducible and having an expansion degree m, said f being used as a generation polynomial of $GF(2^m)$, said root finding circuit comprising:

n cascade-connected exclusive OR gates $X(1, 0)$–$X(1, n-1)$, for integer n set so as to satisfy $0 \leq n < m-3$, each supplied with a corresponding bit of said element "a" at a first input thereof and each supplied with output of an exclusive OR gate of an immediately preceding stage at a second input thereof, a second input of only $X(1, 0)$ being supplied with $a_{m-1}$ instead of the output of an exclusive OR gate of an immediately preceding stage;

m−n−4 cascade-connected exclusive OR gates $X(1, n)$–$X(1, m-5)$ each supplied with a corresponding bit of said element "a" at a first input thereof and each supplied with output of an exclusive OR gate of an immediately preceding stage at a second input thereof, a second input of only $X(1, n)$ being supplied with $a_{m-2}$ instead of the output of an exclusive OR gate of an immediately preceding stage;

a first predetermined number of exclusive OR gates $X(2, 0), X(2, 1), \ldots$, each supplied with $a_{m-1}$ and ao at $X(2, 0)$ and each supplied with output of $X(1, i)$ and $a_0$ at $X(2, i)$ for odd number i that satisfies $0<i<n$, said first predetermined number of exclusive OR gates are determined by said n cascade-connected exclusive OR gates; and a second predetermined number of exclusive OR gates $X(2, n), X(2, n+2), X(2, n+4), \ldots$, each supplied with output of $X(1, n+j)$ for even number j that satisfies $0 \leq j < m-n-4$ at a first input thereof and each supplied with $a_0$ at a second input thereof, said second predetermined number of exclusive OR gates being determined by said m−n−4 cacade-connected exclusive OR gates; wherein outputs of said first predetermined number of exclusive OR gates, outputs of said second predetermined number of exclusive OR gates, outputs of said $X(1, k)$ for even number k that satisfies $0 \leq k < n$, outputs of said $X(1, n+l)$ for odd number l that satisfies $0 \leq l < m-n-4$, said $a_0$ and said $a_{m/2}$ are output as a root $z=(z_0, z_1, \ldots, z_{m-1})$ of $z^2+z+a$.

6. A root finding circuit of a quadratic polynomial over a finite field with respect to an arbitrary element $a=(a_0, a_1, \ldots, a_{m-1})$ and having an expansion degree m, comprising:

a first circuit for finding n outputs z (where n<m−1) by using exclusive OR gates of a predetermined number of stages beginning from a first stage of the circuit; and a second circuit for finding such m−1−n outputs z that those outputs and the output z of said first circuit will not duplicate, by using exclusive OR gates of a predetermined number of stages beginning from a first stage of the circuit, said second circuit being connected to said first circuit, wherein:

said first circuit comprises;

m−3 cascade-connected exclusive OR gate $X(1, 0)$ to $X(1, m-4)$, each supplied with a corresponding bit of said element "a" at a first input thereof and each supplied with output of an exclusive, OR gate of an intermediately preceding stage at a second input, a second input of only X(1, 0) being supplied with $a_{m-1}$ instead of the output of an exclusive OR gate of an immediately preceding stage; and m/2−1 exclusive OR gates X(2, 0) to X(2, m/2−2) respectively supplied with $a_{m-1}$ and output of X(1, 1), X(1, 3), ..., X(1, m−5 at first inputs and each supplied with $a_0$ at a second input thereof, and wherein output Of said exclusive OR gates X(2, 0) to X(2, m/2−2), outputs of said exclusive OR gates X(1, 0), X(1, 2), ..., X(1, m−4), and said $a_0$ are output as a root $z=(z_0, z_1, \ldots, z_{m-1})$ of $z^2+z+a$;

said second circuit comprises:

m−3 cascade-connected exclusive OR gates X(1, 0) to X(1, m−4), each supplied wit a corresponding bit of said element "a" at a first input thereof and each supplied with output of an exclusive OR gate of an intermediately preceding stage at a second input, a second input of only X(1, 0) being supplied wilth $a_{m/2}$ instead of the output of an exclusive OR gate of an immediately preceding stage; and m/2−1 exclusive OR gates X(2, 0) to X(2, m/2−2) reseptively supplied with outputs of X(1, 0), X(1, 2), ..., X(1, m−4) at first inputs and each supplied with $a_0$ at a second input thereof, and wherein output of said exclusive OR gates X(2, 0) to X(2, m/2−2), outputs of said exclusive OR gates X(1, 1), X(1, 3), ..., X(1, m−5, $a_{m/2}$, and $a_0$ are output as a root $z=(z_0, z_1, \ldots, z_{m-1})$ of $z^2+z+a$; and all of the roots $z=(z_0, z_1, \ldots, z_{m-1})$ of $z^2+z+a$ are found.

* * * * *